United States Patent
Lee et al.

(10) Patent No.: US 7,839,680 B2
(45) Date of Patent: Nov. 23, 2010

(54) ELECTRICALLY ERASABLE PROGRAMMABLE READ-ONLY MEMORY (EEPROM) CELL AND METHODS FOR FORMING AND READING THE SAME

(75) Inventors: Yong-Kyu Lee, Gwacheon-si (KR); Jeong-Uk Han, Suwon-si (KR); Hee-Seog Jeon, Suwon-si (KR); Jung-Ho Moon, Seoul (KR); Soung-Youb Ha, Gunpo-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 158 days.

(21) Appl. No.: 12/192,839

(22) Filed: Aug. 15, 2008

(65) Prior Publication Data

US 2009/0059664 A1    Mar. 5, 2009

(30) Foreign Application Priority Data

Aug. 28, 2007    (KR) .................... 10-2007-0086678

(51) Int. Cl.
   *G11C 16/04*    (2006.01)
(52) U.S. Cl. ..................... 365/185.05; 365/185.18
(58) Field of Classification Search .......... 365/185.05, 365/185.18, 189.09
   See application file for complete search history.

(56) References Cited

U.S. PATENT DOCUMENTS

2006/0239079 A1*    10/2006    Mokhlesi et al. ........ 365/185.18

FOREIGN PATENT DOCUMENTS

| KR | 100170293 | 10/1998 |
|---|---|---|
| KR | 1020000038595 | 7/2000 |
| KR | 1020070012582 | 1/2007 |

OTHER PUBLICATIONS

English Abstract for Publication No. 100170293, Oct. 14, 1998.
English Abstract for Publication No. 1020000038595, Jul. 5, 2000.
English Abstract for Publication No. 1020070012582, Jan. 26, 2007.

* cited by examiner

*Primary Examiner*—Vu A Le
(74) *Attorney, Agent, or Firm*—F. Chau & Associates, LLC (57) ABSTRACT

In a method of reading data in an EEPROM cell, a bit line voltage for reading is applied to the EEPROM cell including a memory transistor and a selection transistor. A first voltage is applied to a sense line of the memory transistor. A second voltage greater than the first voltage is applied to a word line of the selection transistor. A current passing through the EEPROM cell is compared with a predetermined reference current to read the data stored in the EEPROM cell. An on-cell current of the EEPROM cell may be increased in an erased state and the data in the cell may be readily discriminated.

9 Claims, 6 Drawing Sheets

ELECTRICALLY ERASABLE PROGRAMMABLE READ-ONLY MEMORY (EEPROM) CELL AND METHODS FOR FORMING AND READING THE SAME

CROSS-REFERENCE TO RELATED APPLICATIONS

This application claims priority under 35 U.S.C. §119 to Korean Patent Application No. 10-2007-0086678 filed on Aug. 28, 2007 in the Korean Intellectual Property Office (KIPO), the contents of which are herein incorporated by reference in their entirety.

BACKGROUND OF THE INVENTION

1. Technical Field

The present invention relate to an electrically erasable programmable read-only memory (EEPROM) cell, and more particularly, to an EEPROM cell and methods for forming and reading the EEPROM cell.

2. Discussion of the Related Art

An electrically erasable programmable read-only memory (EEPROM) device is a memory device that may be electrically programmed and erased. EEPROMs may be able to maintain stored data even in the absence of supplied power.

An EEPROM device in which one transistor constitutes a single memory cell may be referred to as a 1T type flash memory device. An EEPROM device in which two transistors constitute a single memory cell may be referred to as a 2T type flash memory device. For 2T type flash memory devices, the two transistors of the memory cell may include a selection transistor and a memory transistor. Other forms of EEPROM may include a split gate type memory device, a floating gate tunnel oxide (FLOTOX) type memory device, etc.

The 1T type flash memory device may have a small size owing to the fact that each single memory cell includes just one transistor. Accordingly, the 1T type flash memory device may be highly integrated. However, the 1T type flash memory device may be less reliable than the 2T type flash memory device. Thus, the 2T type flash memory device is widely used in a logic device requiring high reliability.

Modern applications require EEPROM devices having large memory capacities and small sizes. Shrinking the size of EEPROM devices has lead to a narrow active region. For example, the gate length of the memory cell transistor has now become narrow. As a result, the capacitance of the memory cell has lowered. The low capacitance of the memory cell may cause low programming and erasing efficiency, such that a threshold voltage of the memory cell under an "On" state may be increased, thereby reducing an on-cell current.

Particularly, the increased write cycle may include repeatedly programming and erasing data in the memory cell so that the threshold voltage of the memory cell may be increased to decrease the on-cell current. When the on-cell current is decreased, a sense amplifier, which may determine the data in the memory cell in accordance with the on-cell current, may fail to discriminate the "On" state, and thus operational failures may be generated.

To overcome the above-mentioned problem, methods of improving characteristics of a tunnel oxide layer in the memory cell through which charges pass have been developed. Accordingly, although programming and erasing the data in the memory cell are repeatedly performed, the threshold voltage of the memory cell may be prevented from increasing by improving the characteristics of the tunnel oxide layer. The tunnel oxide layer having the improved characteristics may prevent the on-cell current from being lowered below an initial on-cell current. However, the tunnel oxide layer having the improved characteristics may not increase the initial on-cell current.

Further, in the memory cell of the 2T type memory device, when data in the memory cell is read, the selection transistor may be provided with efficient capacity in order to increase the on-cell current. The on-cell current may be determined in accordance with the characteristics of the selection transistor under a condition that the threshold voltage of the memory transistor in the memory cell is maintained at a low level in the "On" state.

However, the selection transistors may have a low operational voltage as well as a short gate length and a short gate width. Thus, a current passing through the selection transistor may be relatively small. Therefore, increasing the on-cell current to aid the sense amplifier to discriminate the data may not sufficiently prevent reading failures.

SUMMARY OF THE INVENTION

Exemplary embodiments of the present invention provide a method for accurately reading data in a selected EEPROM cell.

Exemplary embodiments of the present invention provide an EEPROM cell to which the above-mentioned reading method is applicable.

Exemplary embodiments of the present invention provide a method of forming the above-mentioned EEPROM cell.

In a method of reading data in an EEPROM cell in accordance with one aspect of the present invention, a reading bit line voltage is applied to the EEPROM cell including a memory transistor and a selection transistor. A first voltage is applied to a sense line of the memory transistor. A second voltage higher than the first voltage is applied to a word line of the selection transistor. A current passing through the cell is compared with a predetermined reference current to read the data stored in the cell.

According to some exemplary embodiments of the present invention, the first voltage may be between a threshold voltage of the memory transistor in a programmed state of the cell and a threshold voltage of the memory transistor in an erasing state of the cell.

According to some exemplary embodiments of the present invention, the second voltage may be higher than the threshold voltage of the memory transistor in the programmed state of the cell.

According to some exemplary embodiments of the present invention, the second voltage may be about 10% to about 100% higher than the first voltage.

According to some exemplary embodiments of the present invention, the second voltage may be formed by boosting an externally applied voltage using a charge pumping circuit.

According to some exemplary embodiments of the present invention, the charge pumping circuit may include a transistor and a capacitor. A clock signal may be applied to the capacitor and the transistor to boost the voltage.

According to some exemplary embodiments of the present invention, the capacitor of the charge pumping circuit may include a dielectric layer pattern that is made of a material that is substantially the same as a material that is in the tunnel oxide layer of the memory transistor. Moreover, the dielectric layer pattern may also have substantially the same thickness as the tunnel oxide layer of the memory transistor.

According to some exemplary embodiments of the present invention, the first voltage may be formed by decompressing the boosted voltage using the charge pumping circuit.

According to some exemplary embodiments of the present invention, the boosted voltage may be decompressed by dividing a resistance.

An EEPROM cell in accordance with an aspect of the present invention includes a memory transistor, a selection transistor, a charge pumping circuit and a resistance line. The memory transistor includes a first gate structure and first source/drain regions. The first gate structure includes a tunnel oxide layer pattern, a floating gate electrode, a dielectric layer pattern and a control gate pattern, sequentially stacked. The selection transistor is serially coupled to the memory transistor. The selection transistor includes a second gate structure and second source/drain regions. The second gate structure includes a gate oxide layer pattern and a gate electrode, sequentially stacked. The charge pumping circuit has an output terminal connected to the gate electrode of the second gate structure to apply a boosted voltage to the gate electrode of the second gate structure. The resistance line is connected between the output terminal of the charge pumping circuit and the control gate electrode. The resistance line has a resistor for decompressing the boosted voltage using the charge pumping circuit.

According to some exemplary embodiments of the present invention, the charge pumping circuit may include a transistor and a capacitor. A clock signal may be applied to the capacitor and the transistor to boost the voltage.

According to some exemplary embodiments of the present invention, the charge pumping circuit may include a first transistor having a drain region that is connected to an input terminal of the charge pumping circuit, a second transistor serially connected between a source region of the first transistor and the output terminal of the charge pumping circuit, a first capacitor connected between the drain region and a gate electrode of the first transistor and a first signal line for transmitting a first clock signal, and a second capacitor connected between a drain region and a gate electrode of the second transistor, and a second signal line for transmitting a second clock signal.

According to some exemplary embodiments of the present invention, the second clock signal may include a reverse signal of the first clock signal.

According to some exemplary embodiments of the present invention, the charge pumping circuit may further include third through n-th transistors, serially connected between the second transistor and the output terminal, and third through n-th capacitors connected between source regions and gate electrodes of the third through n-th transistors, and signal lines for transmitting third through n-th clock signals, respectively.

According to some exemplary embodiments of the present invention, the even clock signals may be a reverse of the odd clock signals.

According to some exemplary embodiments of the present invention, the capacitors may include a dielectric layer pattern having a thickness substantially the same as that of the tunnel oxide layer pattern of the memory transistor.

According to some exemplary embodiments of the present invention, a first switching transistor may be arranged between the charge pumping circuit and the gate electrode.

According to some exemplary embodiments of the present invention, the resistors of the resistance line may be serially connected to each other. Further, the resistance line may have a grounded end.

According to some exemplary embodiments of the present invention, a second switching transistor may be arranged between the resistance line and the control gate.

In a method of forming an EEPROM cell in accordance with an aspect of the present invention, an oxide layer, a first conductive layer, a preliminary dielectric layer pattern and a second conductive layer are sequentially formed on a substrate divided into a first region and a second region. The second conductive layer, the preliminary dielectric layer pattern, the first conductive layer and the oxide layer in the first region of the substrate are etched to form a first gate structure including a tunnel oxide layer pattern, a floating gate electrode, a dielectric layer pattern and a control gate electrode, sequentially stacked, and a second gate structure including a gate oxide layer pattern and a gate electrode, sequentially stacked. The second conductive layer, the preliminary dielectric layer pattern, the first conductive layer and the oxide layer in the second region of the substrate are etched to form a third gate structure including an oxide layer pattern and a gate electrode, sequentially stacked, and a capacitor including an oxide layer pattern and a conductive layer pattern, sequentially stacked. Impurities are implanted into the substrate between the first, the second and the third gate structures to form source/drain regions. The first, the second and the third gate structure and the capacitor are covered with an insulating interlayer. Wirings are formed on an inner surface and an upper surface of the insulating interlayer. The wirings are partially connected to the source/drain regions and the first, the second and the third gate structures.

According to some exemplary embodiments of the present invention, a resistor may be formed on the second region of the substrate.

According to some exemplary embodiments of the present invention, the first conductive layer and the second conductive layer may include polysilicon.

According to exemplary embodiments of the present invention, in reading the data in the EEPROM cell including the two transistors, a voltage higher than the voltage applied to the sense line may be applied to the word line and an on-cell current of the cell may be increased. Thus, the data in the cell may be readily discriminated so that reading failures may be reduced.

BRIEF DESCRIPTION OF THE DRAWINGS

The above and other features and aspects of exemplary embodiments of the present invention will become more apparent by describing in detailed exemplary embodiments thereof with reference to the accompanying drawings, in which.

DETAILED DESCRIPTION OF THE EXEMPLARY EMBODIMENTS

Exemplary embodiments of the present invention are described more fully hereinafter with reference to the accompanying drawings. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

Hereinafter, some exemplary embodiments of the present invention will be explained in detail with reference to the accompanying drawings.

Figure 1:
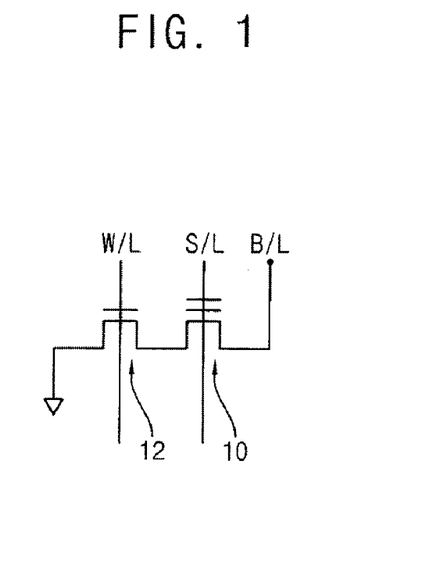
FIG. 1 is a circuit diagram illustrating an EEPROM cell in accordance with some exemplary embodiments of the present invention.
Figure 2:
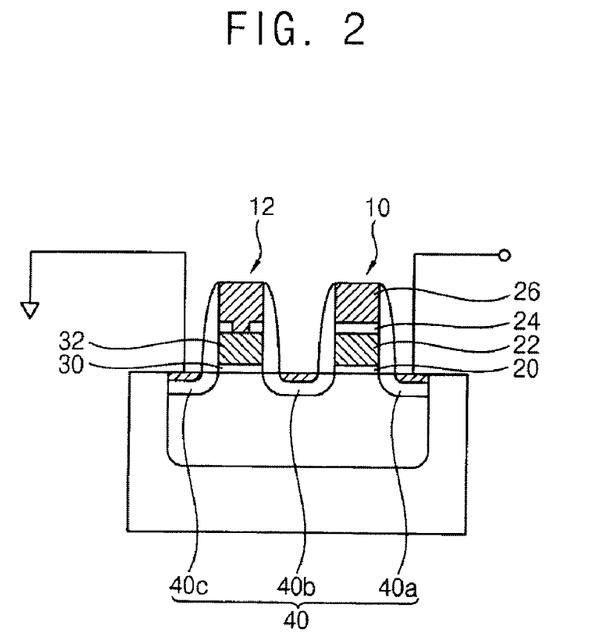
FIG. 2 is a cross-sectional view illustrating the EEPROM on a semiconductor substrate.

FIG. 1 is a circuit diagram illustrating an EEPROM cell in accordance with some exemplary embodiments of the present invention, and FIG. 2 is a cross-sectional view illustrating the EEPROM of FIG. 1 on a semiconductor substrate.

Referring to FIG. 1, a memory cell of an EEPROM device includes a memory transistor 10 and a selection transistor 12 formed on a semiconductor substrate. The memory transistor 10 is programmed and erased by F-N tunneling.

The memory transistor 10 and the selection transistor are serially connected to each other. A drain region 40a (See FIG. 2) of the memory transistor 10 is connected to a bit line B/L. A drain region 40c (See FIG. 2) of the selection transistor 12 is grounded. Further, a control gate electrode of the memory transistor 10 is used as a sense line (S/L). A gate electrode of the selection transistor 12 is used as a word line (W/L).

Referring to FIG. 2, the memory transistor 10 includes a first gate structure having a tunnel oxide layer pattern 20, a floating gate electrode 22, a dielectric layer pattern 24 and a control gate electrode 26, sequentially stacked. The control gate electrode 26 may have a linear shape and may be used as the sense line.

The selection transistor 12 includes a second gate structure having a gate oxide layer pattern 30 and a gate electrode 32, sequentially stacked. The gate electrode 32 may have a linear shape extending along a direction substantially the same as an extending direction of the control gate electrode 26, which may be used as the word line 32.

Impurity regions 40 are formed in the semiconductor substrate at both sides of the first gate structure and the second gate structure. The impurity regions 40 may be provided as source/drain regions of the memory transistor 10 and the selection transistor 12. The source regions 40b of the memory transistor 10 and the selection transistor 12 may be commonly used.

Hereinafter, methods of programming and erasing data in/from the EEPROM cell in FIGS. 1 and 2 will be explained in detail.

To erase the data from the EEPROM cell, a power voltage Vcc of about 0V is applied to the word line (W/L). A negative voltage, for example, about −5V is applied to the sense line (S/L). The bit line (B/L) and the common source regions 40b are provided with a floating state. Charge in the floating gate electrode 22 is discharged and thereafter, the memory transistor 10 may have a threshold voltage of no more than about 0V. Further, when performing the erasing operation, the selection transistor 12 may be maintained at a "Turn-off" state. The erasing state where the data is erased from the cell may be represented as "1" state or "On" state.

To program the data in the EEPROM cell, a programming voltage, for example, about 10V is applied to the sense line (S/L). A negative voltage, for example, about −5V is applied to the bit line (B/L). Further, a negative voltage, for example, about −5V is applied to the word line (W/L). The common source regions 40b are provided with a floating state. Electrons are injected into the floating gate electrode 22 from the bit line (B/L) and thereafter, the memory transistor 10 may have a positive threshold voltage of about 3V. Further, when performing the programming operation, the selection transistor 12 may be maintained at the "Turn-off" state. The programming state where the data is programmed in the cell may be represented as "0" state or "Off" state.

The data may be programmed/erased in/from the EEPROM cell by the above-mentioned methods.

Figure 3:
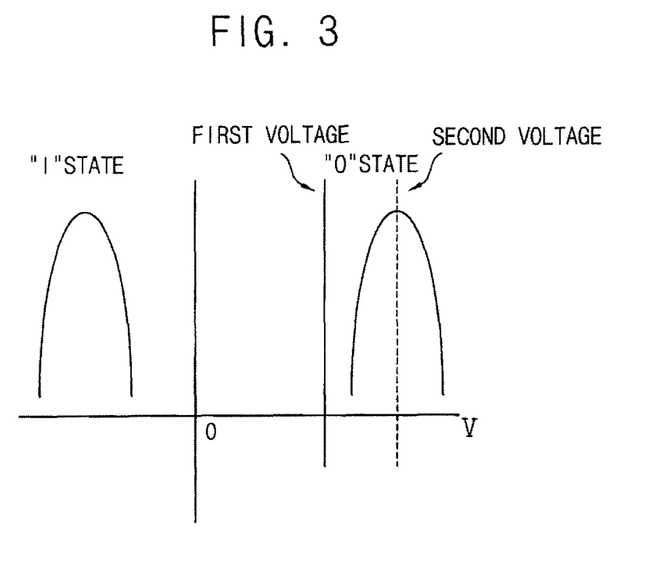
FIG. 3 is a graph showing voltages for reading data in the EEPROM in accordance with some exemplary embodiments of the present invention.

FIG. 3 is a graph showing voltages for explaining a method of reading data in the EEPROM in accordance with some exemplary embodiments of the present invention.

FIG. 3 shows a threshold voltage distribution in the "0" state and the "1" state of the memory transistor in the EEPROM cell. As shown in FIG. 3, the threshold voltages of the memory transistor may vary in accordance with the states of the cell. Thus, although substantially the same voltage is applied to the sense line of the memory transistor, different currents may flow through the cell in accordance with the stages of the cell. The data in the cell may be read using the different currents.

Hereinafter, a method of reading data in the EEPROM cell in accordance with some exemplary embodiments of the present invention will be explained in detail.

A bit line voltage is applied to the bit line (B/L) of the EEPROM cell. The bit line voltage may be substantially equal to or less than the power voltage Vcc. The power voltage Vcc may be about 1.8V.

A first voltage is applied to the sense line (S/L) of the memory transistor 10 in the EEPROM cell. The first voltage may be used to sense the data in the memory transistor 10. Therefore, as shown in FIG. 3, the first voltage may be between a threshold voltage of the memory transistor 10 in a programmed state of the EEPROM cell and a threshold voltage of the memory transistor 10 in an erasing state of the EEPROM cell. Particularly, when the threshold voltage of the memory transistor 10 in a programmed state of the EEPROM cell is about 3V to about 3.3V and the threshold voltage of the memory transistor 10 in an erasing state of the EEPROM cell is about −3V, the first voltage may be between about 2V and about 2.5V. Further, the first voltage may be higher than the power voltage Vcc.

As shown in FIG. 3, a second voltage higher than the first voltage is applied to the word line (W/L) of the selection transistor 12 in the EEPROM cell. Here, since the selection transistor 12 is turned-on, the second voltage may be higher than the threshold voltage of the selection transistor 12.

In this exemplary embodiment, the second voltage may be higher than the first voltage by about 10% to about 100%. Further, the second voltage may be higher than the threshold voltage in the programmed state of the EEPROM cell. For example, the second voltage may be about 2.8V to about 3.3V.

Here, the second voltage may be formed by boosting an externally provided input voltage through a charge pumping circuit. The charge pumping circuit includes a transistor and a capacitor. A clock signal is applied to the capacitor to pump the input voltage. In this exemplary embodiment, the capacitor may include a dielectric layer pattern having a thickness for boosting the input voltage to the second voltage. Particularly, the dielectric layer pattern of the capacitor may have a thickness of about 60 Å to about 80 Å and the second voltage may be accordingly increased by about 2.8V to about 3.3V. Thus, the dielectric layer pattern of the capacitor may have a thickness substantially the same as that of the tunnel oxide layer pattern of the memory transistor 10.

The first voltage may be formed by decompressing a voltage boosted by the charge pumping circuit. To decompress the boosted voltage, a resistance line may be serially connected to an output terminal of the charge pumping circuit. The resistance line may be connected to the control gate electrode 26. For example, the first voltage lower than the second voltage may be applied to the control gate electrode 26 by dividing a resistance using the resistance line.

As mentioned above, when the voltages are applied to the bit line (B/L), the sense line (S/L) and the word line (W/L), the different currents may flow through the EEPROM cell in accordance with the data in the EEPROM cell, for example, the states of the EEPROM cell. For example, when the EEPROM cell is the programmed state, the memory transistor 10 may not be turned-on because the first voltage applied to the control gate electrode 26 of the memory transistor 10 is lower than the threshold voltage. Therefore, although the selection transistor 12 is turned-on, the current may not flow through the EEPROM cell. In contrast, when the EEPROM cell is the erased state, the memory transistor 10 may be turned-on because the first voltage applied to the control gate electrode 26 of the memory transistor 10 is higher than the threshold voltage. Further, the current may flow through the EEPROM cell.

The current flowing through the EEPROM cell is compared with a predetermined reference current to read the data in the selected EEPROM cell. The amount of the reference current may be between the amounts of the currents flowing through the EEPROM cell in the programming state and the erasing state.

According to a conventional method, substantially the same voltage may be applied to the sense line and the word line when reading the data in the EEPROM cell. However, since it may be necessary to apply the voltage, which is lower than the threshold voltage of the memory transistor in the programmed state, to the sense line, the voltages applied to the sense line and the word line may not be boosted to a level as high as the threshold voltage. For example, since the voltage applied to the word line is relatively low, an amount of the current flowing through the memory transistor and the selection transistor when in the erased state of the EEPROM cell may be relatively low.

In contrast, substantially the same voltage may not be applied to the sense line (S/L) and the word line (W/L). The different voltages may be applied to the sense line (S/L) and the word line (W/L). For example, the voltage applied to the word line (W/L) may be higher than that applied to the sense line (S/L). Thus, an amount of the current flowing through the memory transistor 10 and the selection transistor 12 may be increased in the erased state of the EEPROM cell. As a result, the data may be accurately recognized using the different currents through the EEPROM cell and thus reading failures may be suppressed.

It is described below whether the on-cell current is increased when the method of reading the data in the programmed state of the EEPROM cell is used.

Figure 4:
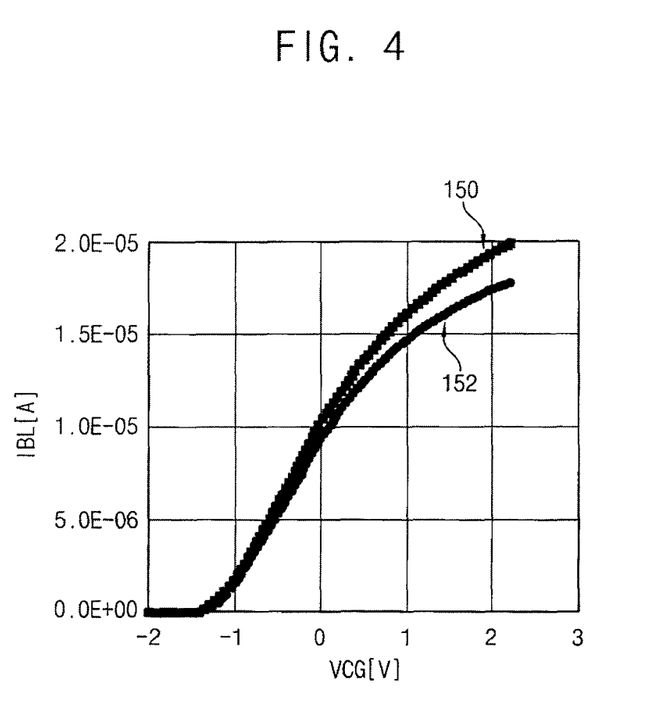
FIG. 4 is a graph showing on-cell currents in accordance with voltages that are applied to a sense line and a word line in an erased state of the cell.

FIG. 4 is a graph showing on-cell currents in accordance with voltages that are applied to a sense line and a word line in an erased state of the cell.

Voltages of about −2V to about 2.2V are applied to the sense line, for example, the control gate electrode. About 2.8V is applied to the word line, for example, the gate electrode. A current 150 flowing through the EEPROM cell is measured.

Voltages of about −2V to about 2.2V are applied to the sense line. About 2.2V is applied to the word line. A current 152 flowing through the EEPROM cell is measured.

As shown in FIG. 4, when the voltage of at least about 0V is applied to the sense line, an amount of the on-cell current when about 2.8V is applied to the word line is greater than an amount of the on-cell current when about 2.2V is applied to the word line. As a result, when the voltage applied to the word line reaches the threshold voltage of the memory transistor in the programmed state of the EEPROM cell, a relatively large amount of the on-cell current flows through the EEPROM cell. Further, a large amount of the on-cell current may flow through the EEPROM cell by increasing the voltage applied to the word line of the selection transistor.

Hereinafter, an EEPROM cell for which the method of reading the data is applicable is explained in detail.

Figure 5:
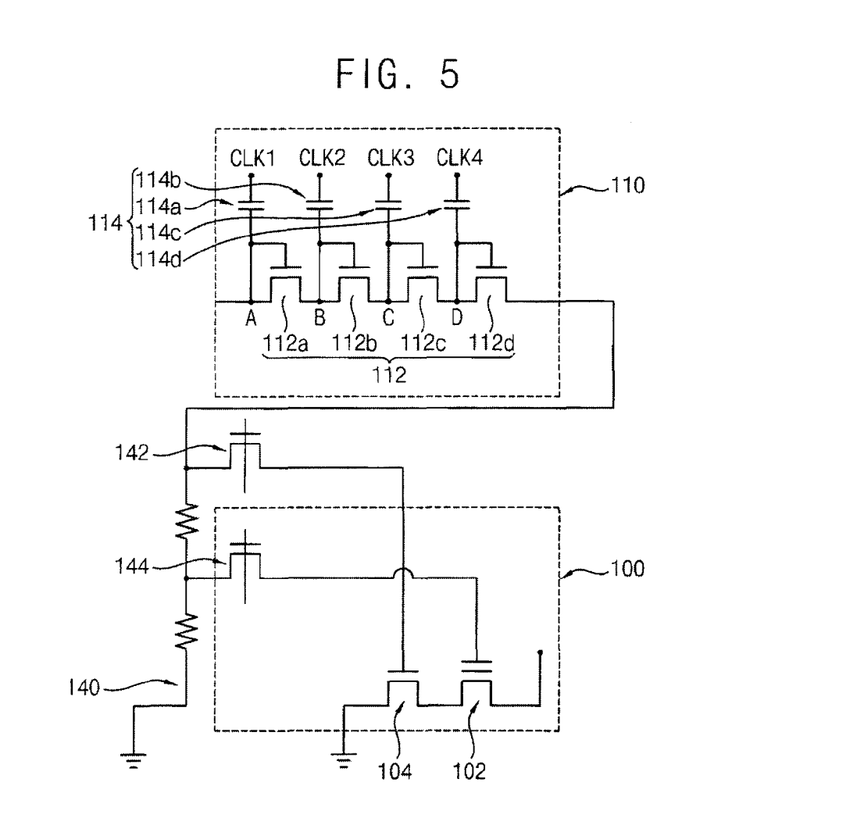
FIG. 5 is a circuit diagram illustrating an EEPROM cell and a peripheral circuit connected to the EEPROM cell in accordance with some exemplary embodiments of the present invention.

FIG. 5 is a circuit diagram illustrating an EEPROM cell and a peripheral circuit connected to the EEPROM cell in accordance with some exemplary embodiments of the present invention.

Referring to FIG. 5, an EEPROM 100 includes a memory transistor 102 having a first gate structure and source/drain regions. The first gate structure includes a tunnel oxide layer pattern, a floating gate electrode, a dielectric layer pattern and a control gate electrode, sequentially stacked.

The memory transistor 102 may be formed on a semiconductor substrate including single crystalline silicon. Particularly, the tunnel oxide layer pattern may include silicon oxide. Further, the tunnel oxide layer pattern may have a thickness of about 60 Å to about 80 Å. The floating gate electrode and the control gate electrode may include polysilicon. The dielectric layer pattern may include one or more of metal oxide, silicon oxide/silicon nitride/silicon oxide (ONO), and the like The drain region of the memory transistor 102 may be connected to a bit line. The control gate electrode of the memory transistor 102 may extend along a first direction and may also be used as a control gate electrode of an adjacent memory transistor. Further, the control gate electrode may function as a sense line of the memory transistor 102.

A selection transistor 104 is serially connected to the memory transistor 102. The selection transistor 104 includes a gate oxide layer pattern and a gate electrode, sequentially stacked. A source region of the selection transistor 104 may be electrically connected to the source region of the memory transistor 102. The source regions of the selection transistor 104 and the memory transistor 102 may be commonly used. Further, a drain region of the selection transistor 104 may be grounded. The gate electrode of the selection transistor 104 may extend along the first direction and may also be used as a common gate electrode of an adjacent selection transistor. The gate electrode of the selection transistor 104 may function as a word line.

A charge pumping circuit 110 is connected to the gate electrode, for example, the word line of the selection transistor 104. The charge pumping circuit 110 has an output terminal connected to the gate electrode of the selection transistor 104 and thus a voltage outputted from the charge pumping circuit 110 is applied to the gate electrode. Here, the charge pumping circuit 110 may boost an externally supplied input voltage.

The charge pumping circuit 110 includes transistors 112 and capacitors 114. Clock signals are applied to the capacitors 114 and thus the input voltages may be sequentially boosted. The capacitors 114 of the charge pumping circuit 110 may include a dielectric layer formed by a process substantially the same as that for forming the tunnel oxide layer of the memory transistor 102. Thus, the process for forming the capacitors 114 of the charge pumping circuit 110 may be omitted. As a result, electrical characteristics of the capacitors 114 may be determined in accordance with characteristics of the tunnel oxide layer.

Hereinafter, the charge pumping circuit 110 of some exemplary embodiments is explained in detail. Here, the charge pumping circuit 110 may include elements capable of boosting the input voltage in addition to or in place of those shown in FIG. 5.

As shown in FIG. 5, the charge pumping circuit 110 includes a first NMOS transistor 112a connected to the input terminal. A drain region of the first NMOS transistor 112a may be electrically connected to the input terminal.

Second, third and fourth NMOS transistors 112b, 112c and 112d may be serially connected to each other and arranged between a source region of the first NMOS transistor 112a and the output terminal. There may be four NMOS transistors. Alternatively, there may be more or less than four NMOS transistors.

A first capacitor 114a is arranged between the drain region and the gate electrode of the first NMOS transistor 112a, and a first signal line for transmitting a first clock signal. A first electrode of the first capacitor 114a is connected to the drain region and the gate electrode of the first NMOS transistor 112a. A second electrode of the first capacitor 114a is connected to the first clock signal line.

A second capacitor 114b is arranged between the drain region and the gate electrode of the second NMOS transistor 112b, and a second signal line for transmitting a second clock signal. A first electrode of the second capacitor 114b is connected to the drain region and the gate electrode of the second NMOS transistor 112b. A second electrode of the second capacitor 114b is connected to the second clock signal line. Here, the second clock signal applied to the second clock signal line may be a reverse signal of the first clock signal applied to the first clock signal line.

A third capacitor 114c is arranged between the drain region and the gate electrode of the third NMOS transistor 112c, and a third signal line for transmitting a third clock signal. A first electrode of the third capacitor 114c is connected to the drain region and the gate electrode of the third NMOS transistor 112c. A second electrode of the third capacitor 114c is connected to the third clock signal line. Here, the third clock signal applied to the third clock signal line may be substantially the same as the first clock signal applied to the first clock signal line.

A fourth capacitor 114d is arranged between the drain region and the gate electrode of the fourth NMOS transistor 112d, and a fourth signal line for transmitting a fourth clock signal. A first electrode of the fourth capacitor 114d is connected to the drain region and the gate electrode of the fourth NMOS transistor 112d. A second electrode of the fourth capacitor 114d is connected to the fourth clock signal line. Here, the fourth clock signal applied to the fourth clock signal line may be a reverse signal of the first clock signal applied to the first clock signal line. For example, each of the odd numbered clock signals may be substantially the same as the first clock signal. In contrast, each of the even clock signals may be the reverse signal of the first clock signal.

Alternatively, there may be more or less NMOS transistors and the capacitors than described above and illustrated in FIG. 5. For example, there may be more than four NMOS transistors or capacitors. In this case, the NMOS transistors and the capacitors may have the above-mentioned connections. When there are more capacitors, the input voltage may be boosted to a greater extent. The numbers of the capacitors may be adjusted in accordance with voltages applied to the word line.

Hereinafter, operation of the charge pumping circuit will be described in detail.

Figure 6:
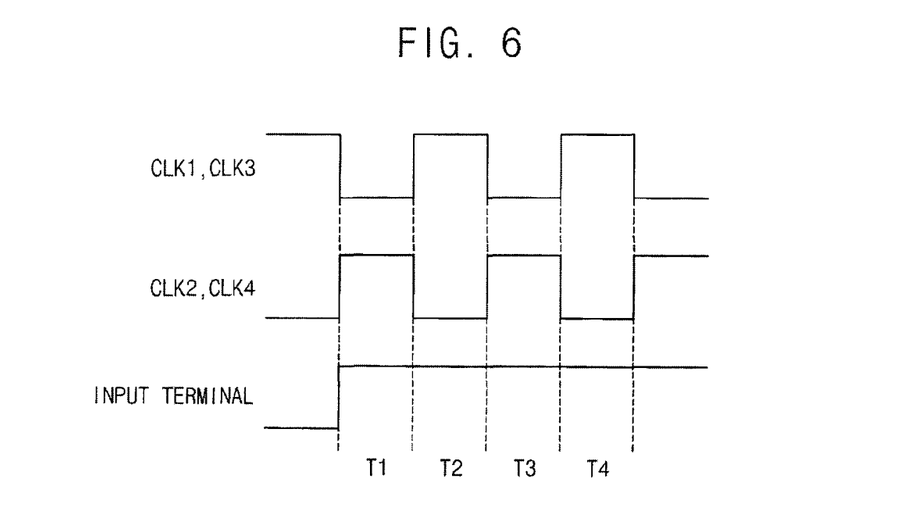
FIG. 6 is a timing chart showing voltages applied to an input terminal of a charge pumping circuit and first, second, third and fourth clock signal lines.

FIG. 6 is a timing chart showing voltages applied to an input terminal of a charge pumping circuit and first, second, third and fourth clock signal lines.

The externally provided input voltage is applied to the input terminal of the charge pumping circuit.

Referring to FIG. 6, when the first clock signal and the third clock signal are maintained at a high level and the second clock signal and the fourth clock signal are maintained at a low level for a duration time T1, a first node voltage A (See FIG. 5) is converted into a first swing voltage higher than the input voltage. Further, the first node voltage A is transmitted to a second node voltage B (See FIG. 5) through the first NMOS transistor that is connected between the first node voltage A and the second node voltage B via a diode and thus the second node voltage B is increased to the first swing voltage.

When the first clock signal and the third clock signal are maintained at a low level and the second clock signal and the fourth clock signal are maintained at a high level for a duration time T2, the second node voltage B is converted into a second swing voltage higher than the first swing voltage. Further, the second node voltage B is transmitted to a third node voltage C (See FIG. 5) through the second NMOS transistor that is connected between the second node voltage B and the third node voltage C via a diode and thus the third node voltage C is increased to the second swing voltage.

When the clock signals are applied for duration times T3 and T4 as shown in FIG. 6, the node voltages are gradually increased to output a fourth swing voltage, for example, a second voltage from the output terminal.

When the input voltage, for example, the power voltage of the charge pumping circuit 110 is about 1.8V, the output voltage may be about 3V to about 3.3V. Particularly, the output voltage of about 3V to about 3.3V may be outputted by providing the capacitors of the charge pumping circuit 110 with the dielectric layer having a thickness of about 60 Å to about 80 Å. Further, the dielectric layer may have a thickness and a material substantially the same as those of the tunnel oxide layer of the memory transistor in the EEPROM cell.

Additionally, a first switching transistor 142 may be arranged between the output terminal and the gate electrode of the charge pumping circuit 110. The first switching transistor 142 may apply a voltage to the gate electrode through another input line, as opposed to applying the voltage through the charge pumping circuit 110, in accordance with operational modes.

Further, an end of a resistance line 140 for decompressing a voltage is connected to the output terminal of the charge pumping circuit 110. The resistance line 140 includes resistors for decompressing the boosted voltage by the charge pumping circuit 110. The resistors of the resistance line 140 may be serially connected to each other. Further, the other end of the resistance line 140 is grounded.

The resistance line 140 is connected to the control gate electrode, for example, the sense line of the memory transistor 120. Thus, the output voltage from the charge pumping circuit 110 may be decreased owing to the resistors of the resistance line 140. The decreased voltage may be applied to the control gate electrode.

Additionally, a second switching transistor 144 may be arranged between the resistance line 140 and the control gate electrode. The second switching transistor 144 may apply a voltage to the control gate electrode through another input line, as opposed to applying the voltage through the charge pumping circuit 110 and the resistance line 140.

Hereinafter, a method of forming the EEPROM cell of FIG. 5 is described in detail.

FIGS. 7 to 11 are cross-sectional views illustrating a method of forming the EEPROM cell in FIG. 5 on a semiconductor substrate.

Figure 7:
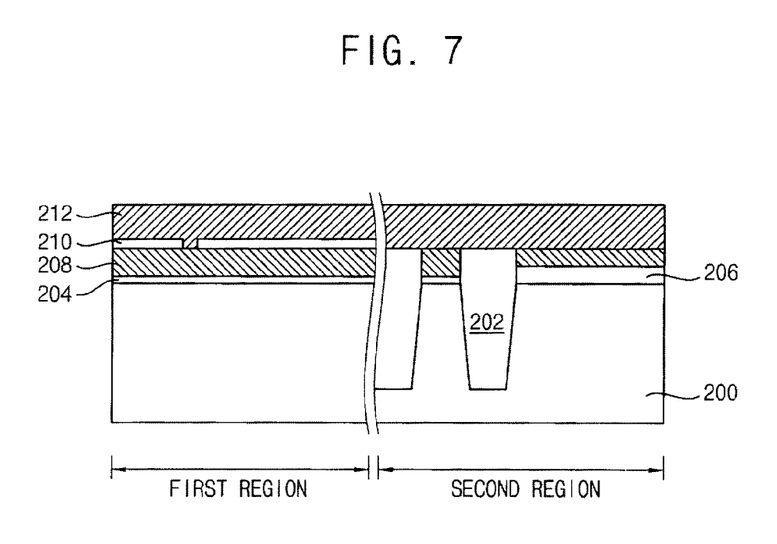
FIGS. 7 to 11 are cross-sectional views illustrating a method of forming the EEPROM cell in FIG. 5 on a semiconductor substrate.

Referring to FIG. 7, a semiconductor substrate 200 is prepared. The semiconductor substrate 200 may include a semiconductor material such as single crystalline silicon. The semiconductor substrate 200 is divided into a first region where memory cell are formed, and a second region where peripheral circuits for driving the memory cells are formed.

A shallow trench isolation (STI) process is performed on the semiconductor substrate 200 to form isolation layer patterns 202, thereby dividing the semiconductor substrate 200 into an isolation region and an active region. Impurities are implanted into the substrate 200 where a channel region of a transistor and an electrode of a capacitor in the memory cell are to be formed.

The semiconductor substrate 200 is thermally oxidized to form a first oxide layer 204. The first oxide layer 204 may be used for a tunnel oxide layer of a memory transistor, a gate oxide layer of a selection transistor, a dielectric layer of the capacitor, etc. Further, the first oxide layer 204 may have a thickness that varies in accordance with electrical characteristics of the memory transistor, the selection transistor and the capacitor. The first oxide layer 204 may have a thickness of about 50 Å to about 100 Å. Particularly, when the EEPROM cell is used in a device having a design rule of no more than about 110 nm and an operational voltage of about 1.5V to about 2V, the first oxide layer 204 may have a thickness of about 60 Å to about 80 Å.

Further, a high voltage transistor may be formed on the second region of the semiconductor substrate 200. Thus, a relatively thick second oxide layer 206 is formed on the second region of the semiconductor substrate 200 where the high voltage transistor is to be formed. For example, the second oxide layer 206 on the second region of the semiconductor substrate 200 where the high voltage transistor is to be formed may have a thickness of about 100 Å to about 300 Å. Further, since a relatively high voltage may be applied to an N type transistor in a charge pumping circuit, the relatively thick second oxide layer 206 may be formed on the second region of the semiconductor substrate 200.

A first conductive layer 208 is formed on the first oxide layer 204 and the second oxide layer 206. Here, the first conductive layer 208 may be used as a floating gate electrode. The first conductive layer 208 may include polysilicon doped with impurities. Further, the first conductive layer 208 may have a linear shape extending along a first direction. The first conductive layer 208 may be formed by a damascene process using the isolation layer patterns 202 as a mold pattern.

A dielectric layer (not shown) is formed on the first conductive layer 208. The dielectric layer may include metal oxide having a high dielectric constant. Alternatively, the dielectric layer may include silicon oxide/silicon nitride/silicon oxide (ONO).

The dielectric layer is partially etched to form a preliminary dielectric layer pattern 210. For example, a portion of the dielectric layer where the selection transistor, the capacitor and the high voltage transistor are to be formed may be etched. Thus, the first conductive layer 208 exposed through the etched portion of the dielectric layer may make contact with a second conductive layer 212 formed by a following process.

The second conductive layer 212 is formed on the preliminary dielectric layer pattern 210. The second conductive layer 212 may be used for a control gate electrode. Further, the second conductive layer 212 may include polysilicon doped with impurities.

Figure 8:
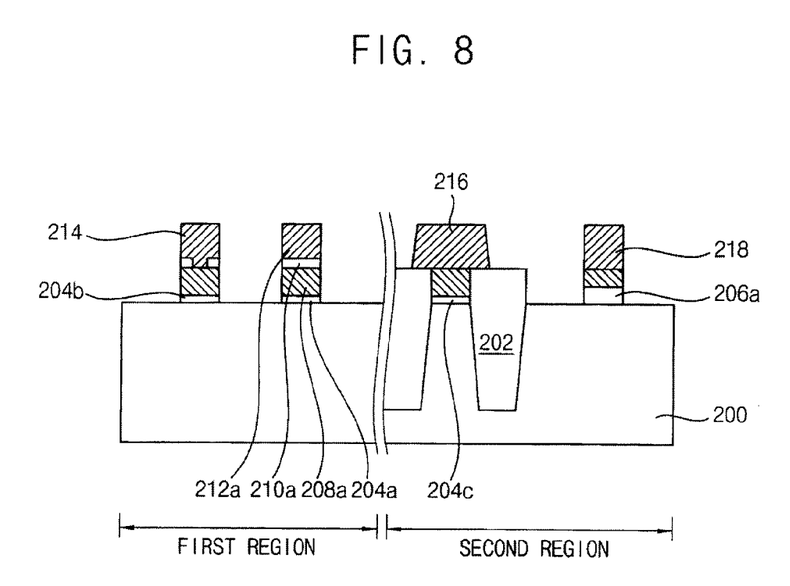

Referring to FIG. 8, a mask pattern (not shown) is formed on the second conductive layer 212. The second conductive layer 212, the preliminary dielectric layer pattern 210, the first conductive layer 208 and the first oxide layer 204 are sequentially etched using the mask pattern as an etching mask to form a first gate structure, a second gate structure, a third gate structure, a capacitor and resistance layer patterns.

The first gate structure includes a tunnel oxide layer pattern 204a, a floating gate electrode 208a, a dielectric layer pattern 210a and a control gate electrode 212a, sequentially stacked, on the first region of the semiconductor substrate 200. The first gate structure may function as a gate of the memory transistor in the EEPROM cell.

Further, the second gate structure includes a gate oxide layer pattern 204b and a gate electrode 214, sequentially stacked, on the first region of the semiconductor substrate 200 adjacent to the first gate structure. Here, since portions where the preliminary dielectric layer pattern 210 is not placed are patterned, the second gate structure does not include the dielectric layer pattern. Thus, the second gate structure may function as a gate of the selection transistor in the EEPROM cell. Further, the second gate structure may be arranged substantially in parallel with the first gate structure.

The third gate structure includes a gate oxide layer pattern 206a and a gate electrode 218, sequentially stacked, on the second region of the semiconductor substrate 200. The gate oxide layer pattern 206a in the second region may have a thickness greater than that of the gate oxide layer pattern 204b in the selection transistor in the cell region.

The capacitor includes a dielectric layer pattern 204c and a conductive layer pattern 216, sequentially stacked, on the second region of the semiconductor substrate 200. For example, the capacitor may be formed by providing impurity regions (not shown) under the second region of the semiconductor substrate 200 as a lower electrode, and the conductive layer pattern 216 as an upper electrode.

The third gate structure and the capacitor may be provided as unit elements of the charge pumping circuit. Here, the dielectric layer pattern 204c of the capacitor may include a same material as is included in the tunnel oxide layer pattern 204a of the memory transistor. Moreover, the dielectric layer pattern 204c of the capacitor may have substantially the same thickness as the tunnel oxide layer pattern 204a of the memory transistor.

The resistance layer patterns (not shown) are formed on the second region of the semiconductor substrate 200. The resistance layer patterns may include polysilicon.

Figure 9:
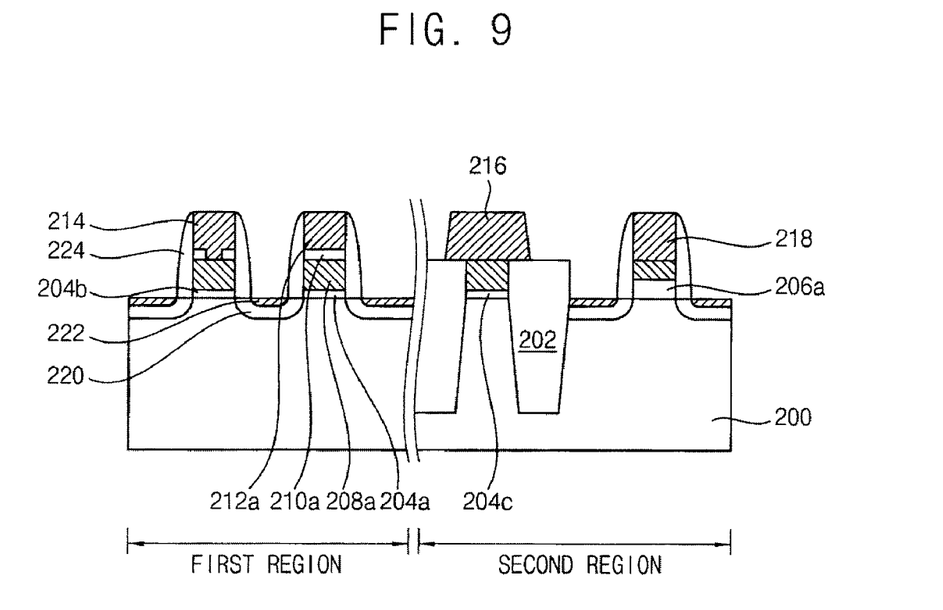

Referring to FIG. 9, impurities are implanted into the semiconductor substrate 200 between the first, the second and the third gate structures to form impurity regions 220.

Gate spacers 224 are formed on sidewalls of the first, the second and the third gate structures. Impurities are then implanted into the semiconductor substrate 200 between the gate spacers 224 and thus heavily doped impurity regions 222 are formed.

By the impurity implantation processes, the memory transistor and the selection transistor are formed on the first region of the semiconductor substrate 200. The memory transistor and the selection transistor may be serially connected with each other. Further, transistors used for the charge pumping circuit may be formed on the second region of the semiconductor substrate 200. The transistors may be serially connected with each other. The impurity regions 220 and the heavily doped impurity regions 222 may server as source/drain regions of the transistors, respectively.

Figure 10:
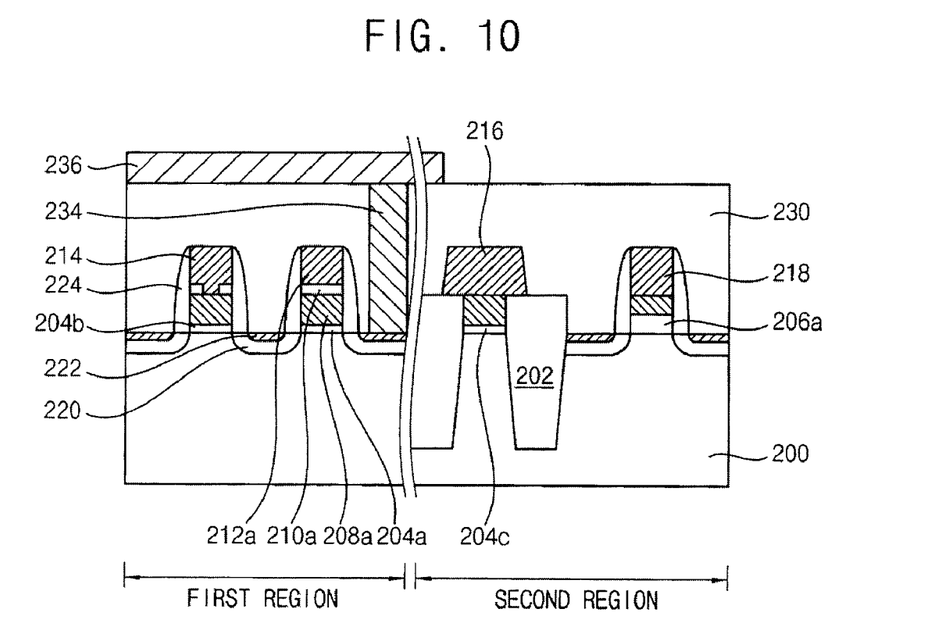

Referring to FIG. 10, a first insulating interlayer 230 covers the first, the second and the third gate structures and the capacitor. The first insulating interlayer 230 may include silicon oxide such as undoped silicate glass (USG), tetraethyl-ortho-silicate (TEOS), high density plasma (HDP) oxide, and the like.

The first insulating interlayer 230 is anisotropically etched to form a first opening partially exposing the drain region of the memory transistor. A conductive layer (not shown) is formed in the first opening and the first insulating interlayer 230. The conductive layer is patterned along a second direction substantially perpendicular to the first direction to form a bit line structure including a bit line contact 234 and a bit line 236.

Figure 11:
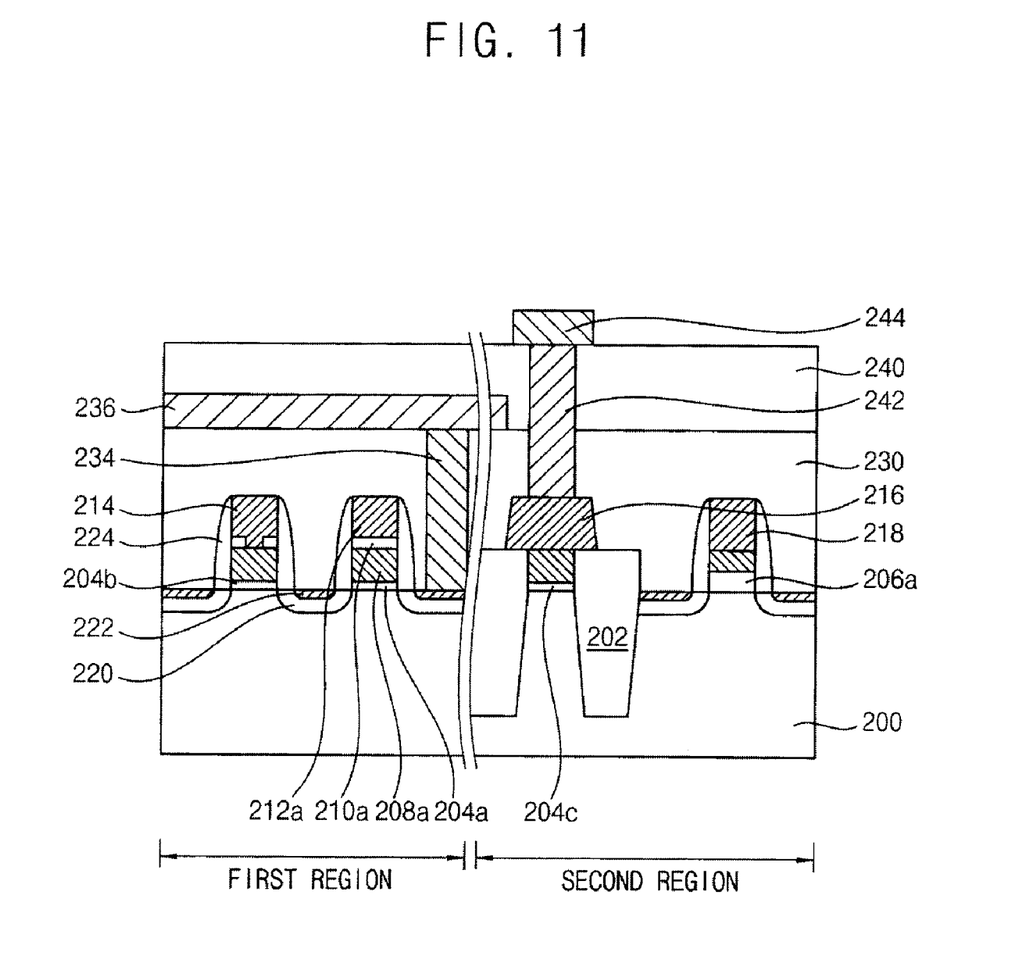

Referring to FIG. 11, a second insulating interlayer 240 is formed on the first insulating interlayer 230. The second insulating interlayer 240 and the first insulating interlayer 230 are anisotropically etched to form a second opening exposing a conductive layer pattern in the capacitor. A conductive layer (not shown) is formed in the second opening and the second insulating interlayer 240. The conductive layer is then patterned such that a contact plug 242 and a conductive line 244, through which clock signals applied to the electrode of the capacitor are transmitted, is formed.

According to some exemplary embodiments of the present invention, in reading the data in the EEPROM cell including the two transistors, the voltage higher that the voltage applied to the sense line may be applied to the word line and an on-cell current of the cell may be increased. Accordingly, the data in the cell may be readily discriminated and reading failures may be reduced.

The foregoing is illustrative of the present invention and is not to be construed as limiting thereof. Although exemplary embodiments of the present invention have been described, those skilled in the art will readily appreciate that many modifications are possible in the exemplary embodiments without materially departing from the present invention. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the disclosure.

What is claimed is:

1. An EEPROM cell comprising:
    a memory transistor including a first gate structure, a first source region and a first drain region, the first gate structure including a tunnel oxide layer pattern, a floating gate electrode, a dielectric layer pattern and a control gate pattern, sequentially stacked;
    a selection transistor, connected in series to the memory transistor, the selection transistor including a second gate structure, a second source region and a second drain region, the second gate structure including a gate oxide layer pattern and a gate electrode, sequentially stacked;
    a charge pumping circuit connected to the gate electrode of the second gate structure and applying a boosted voltage to the gate electrode of the second gate structure; and
    a resistance line connected between the charge pumping circuit and the control gate pattern, the resistance line having a resistor for decompressing the boosted voltage.

2. The EEPROM cell of claim 1, wherein the charge pumping circuit comprises a transistor and a capacitor, and wherein a clock signal is applied to the capacitor and the transistor to generate the boosted voltage.

3. The EEPROM cell of claim 1, wherein the charge pumping circuit comprises;
    a first transistor having a drain region that is connected to an input terminal of the charge pumping circuit;
    a second transistor serially connected between a source region of the first transistor and the output terminal of the charge pumping circuit;
    a first capacitor connected between the drain region of the first transistor, a gate electrode of the first transistor, and a first signal line for transmitting a first clock signal; and
    a second capacitor connected between a drain region of the second transistor, a gate electrode of the second transistor, and a second signal line for transmitting a second clock signal.

4. The EEPROM cell of claim 3, wherein the second clock signal is a reverse signal of the first clock signal.

5. The EEPROM cell of claim 3, wherein the charge pumping circuit further comprises:
    third through n-th transistors serially connected between the second transistor and the output terminal of the charge pumping circuit; and
    third through n-th capacitors connected between source regions and gate electrodes of the third through n-th transistors, and signal lines for transmitting third through n-th clock signals, respectively.

6. The EEPROM cell of claim 5, wherein even clock signals of the third through n-th clock signals are reverse signals of odd clock signals of the third through n-th clock signals.

7. The EEPROM cell of claim 2, wherein the capacitor of the charge pumping circuit comprises a dielectric layer pattern having a thickness substantially the same as that of the tunnel oxide layer pattern of the memory transistor.

8. The EEPROM cell of claim 1, further comprising a first switching transistor arranged between the charge pumping circuit and the gate pattern.

9. The EEPROM cell of claim 8, further comprising a second switching transistor arranged between the resistance line and the control gate pattern.

* * * * *